(12) United States Patent
Hachmann

(10) Patent No.: US 7,366,031 B2
(45) Date of Patent: Apr. 29, 2008

(54) MEMORY ARRANGEMENT AND METHOD FOR ADDRESSING A MEMORY

(75) Inventor: Ulrich Hachmann, Neubiberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/497,536

(22) Filed: Aug. 1, 2006

(65) Prior Publication Data

US 2007/0047370 A1   Mar. 1, 2007

(30) Foreign Application Priority Data

Aug. 2, 2005   (DE) .................. 10 2005 036 267

(51) Int. Cl.
*G11C 7/00* (2006.01)
*G11C 8/00* (2006.01)

(52) U.S. Cl. .................. 365/189.02; 365/189.08; 365/189.12; 365/230.02; 365/240

(58) Field of Classification Search .......... 365/189.02, 365/189.05, 189.08, 189.12, 230.02, 230.03, 365/230.08, 240

See application file for complete search history.

(56) References Cited

U.S. PATENT DOCUMENTS

| | | | | |
|---|---|---|---|---|
| 5,886,930 A | * | 3/1999 | Maclellan et al. | 365/189.02 |
| 6,389,520 B2 | * | 5/2002 | Christenson | 365/230.03 |
| 6,603,690 B1 | * | 8/2003 | Chen et al. | 365/189.12 |

FOREIGN PATENT DOCUMENTS

| | | |
|---|---|---|
| EP | 0 205 936 B1 | 3/1992 |
| EP | 0 886 279 B1 | 11/2004 |
| WO | WO 2004/051449 A2 | 6/2004 |

* cited by examiner

*Primary Examiner*—Trong Phan
(74) *Attorney, Agent, or Firm*—Brinks Hofer Gilson & Lione

(57) ABSTRACT

A memory arrangement includes a plurality of switching elements arranged in the form of a binary tree. The memory elements are supplied with data to be stored by the switching elements coupled to the leaves of the binary tree.

16 Claims, 5 Drawing Sheets

MEMORY ARRANGEMENT AND METHOD FOR ADDRESSING A MEMORY

PRIORITY CLAIM

This application claims the benefit of priority of German Patent Application No. 10 2005 036 267.2, filed Aug. 2, 2005, the contents of which are incorporated by reference herein.

BACKGROUND

1. Technical Field

The invention relates to a memory arrangement and a method for addressing a memory arrangement. In particular, the invention relates to a memory arrangement configured in a hierarchical manner.

2. Background Information

Reducing the power dissipation of integrated circuits (IC) has become more and more important in recent times. The reason for this is, on the one hand, that integrated circuits are increasingly used in mobile devices which are supplied with energy by means of a battery, for example in mobile radio stations. It is desirable, therefore, that the integrated circuits have low energy consumption to avoid, for example, frequent recharging of batteries.

DETAILED DESCRIPTION

Figure 1:
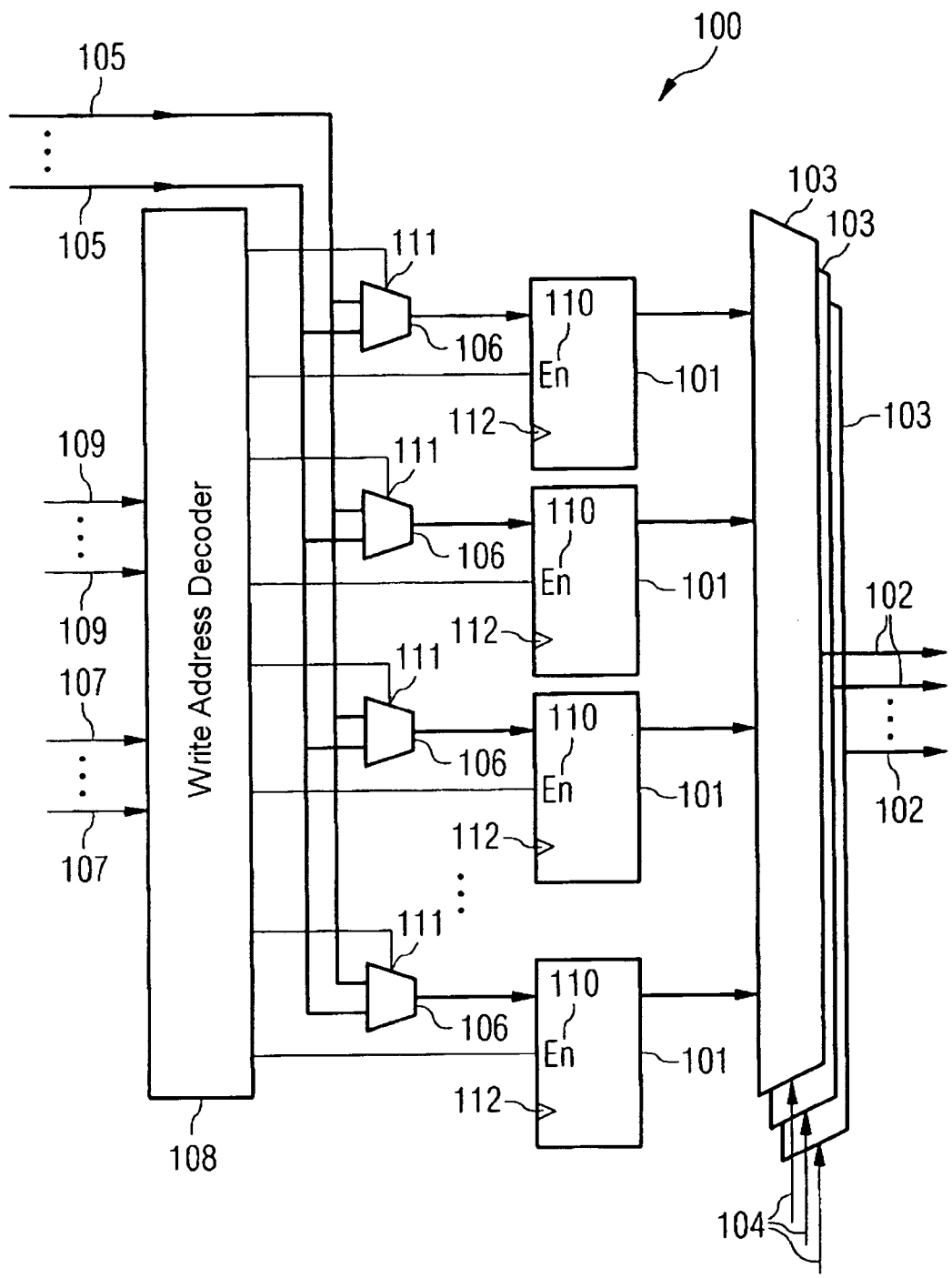
FIG. 1 shows a register bank.

Apart from lowering energy consumption, a further reason for the desire to reduce the power dissipation of integrated circuits consists in that an integrated circuit having a high power dissipation heats up severely in operation and the heat removal is typically very complex when integrated circuits with very high power which correspondingly heat up very severely.

A multiplicity of integrated circuits has a programmable processor as a component. In processors, register banks are one of the units which contribute most to the power dissipation of the processor or of the integrated circuit, respectively, part of which the processor is. The greatest proportion of the power dissipation of integrated circuits (or digital circuits, respectively) is produced by the recharging of electrical connections (for which current must be correspondingly supplied). An electrical connection is recharged when a signal change takes place on the electrical connection, i.e. a change from high level to low level or from low level to high level. Each electrical connection has an electrical capacitance which is composed of the capacitance of the metal line (which forms the electrical connection) itself and the capacitance of the transistor terminals coupled to the metal line. The power dissipation of a digital circuit can be approximated by the formula:

$$p = \Sigma(\alpha \cdot f \cdot C \cdot V^2)$$

where summing is over all electrical connections of the digital circuit, $\alpha$ is the signal activity on the respective electrical connection, f is the clock frequency of the circuit unit to which the signal is allocated, C is the capacitance of the respective electrical connection and V is the supply voltage on the respective electrical connection.

The signal activity of a signal (which is present on an electrical connection) is a measure of the probability with which the signal will change from logical level 0 to logical level 1 and from the logical level 1 to the logical level 0 within one clock cycle. Accordingly, a signal which changes only once at a maximum within one clock cycle (for example the signal output by a flip flop) has a maximum signal activity of 0.5.

The power dissipation of a register bank forms a particularly high proportion of the power dissipation of a processor when it is built up of standard cells (flip flops and logic gates) and when it has a high number of write ports and read ports as are required, for example, in VLIW (very long instruction word) processors. In this case, the area required by the register bank on the chip on which it is arranged is very large which leads to very long electrical connections being required and the capacitances of the electrical connections thus being very large.

A reduction in the area required by the register bank and correspondingly a reduction in the capacitances of the electrical connections can be achieved if the register bank is already developed at layout level (full custom design) or if the number of read ports and/or of write ports of the register bank is reduced. However, these two possibilities restrict the flexibility of the corresponding processor and are used only rarely, therefore.

A further possibility for reducing the power dissipation of a processor consists in reducing the clock frequency at which the processor is operated since this also enables the supply voltage of the processor to be reduced. However, this measure also reduces the processing power of the processor.

A register bank has the function of storing data in the form of data words in a number of addressable register words, wherein a register word can store one data word, for example 32 bits. A register bank typically has a number of read ports so that a number of the data words stored in the register bank can be read out simultaneously. Each read port has an address input by means of which the read port can be supplied with the address of the register word, in which the data word is stored which is to be read out and to be forwarded to the data output of the read port.

Analogously, a number of register words of the register bank can be written simultaneously by a number of write ports of the register bank. Using an address input of a write port, the write port can be supplied with an address which addresses the register word of the register bank in which the data word present at the data input of the write port is to be stored. The width of the data inputs and data outputs of the write ports and read ports and the width of the register words is typically identical (for example 32 bits).

FIG. 1 shows a register bank 100. The register bank 100 has a multiplicity of register words 101 by which one data word can be stored in each case. The register bank has a plurality of data outputs 102, each data output 102 being the output of a multiplexer of a plurality of output multiplexers 103. Each multiplexer of the plurality of output multiplexers 103 has a read address input 104. Each register word of the plurality of register words 01 is addressable by means of a read address word. If an output multiplexer 103 of the plurality of output multiplexers 103 is supplied, by the corresponding read address input, with the address of a register word 101, i.e. the address word which addresses the register word 101, the output multiplexer 103 forwards the data word stored in the addressed register word 101 to its data output 102.

If the output multiplexers 103 are supplied with different addresses, a number of data words can be read out simultaneously which are stored in different register words 101.

The register bank 100 also has a plurality of data inputs 105. A data word to be stored is supplied to the register bank 100 by a data input 105. The register bank 100 can be supplied simultaneously with a number of data words to be stored. The plurality of data inputs 105 are coupled to input multiplexers 106, each register word 101 being associated with exactly one input multiplexer 106 and being coupled to the output of its associated input multiplexer 106. All data words to be stored are supplied to all input multiplexers 106.

The register bank 100 also has a plurality of write address inputs 107, each write address input 107 being associated with exactly one data input 105 and, if the register bank 100 is supplied with a data word by a data input 105, the register bank being supplied, by the write address input 107 associated with the data input 105, with the address (the address word) of the register word 101 by which the data word is stored. The write address inputs are coupled to a write address decoder 108.

The write address decoder 108 is also coupled to a plurality of write enable inputs 109 of the register bank 100. Analogously to the write address inputs 107, each write enable input 109 is associated with exactly one data input 105. A write enable input 109 can be used for signaling to the register bank 100 whether a data word which is supplied to the register bank 100 by the data input 105 associated with the write enable input 109 is to be stored by the register bank 100.

Each of the register words 101 also has an enable input 110 and each input multiplexer 106 has an input multiplexer address input 111.

If the register bank 100 is supplied, by a data input 105, with a data word to be stored which is to be stored by means of a register word 101, the write address decoder 108, as mentioned, is supplied with the address of the register word 101 by means of the write address input 107 associated with the data input 105. Furthermore, the register bank 100 is informed by the write enable input 109 associated with the data input 105 that the data word supplied is to be stored.

By means of the input multiplexer address input 111 of the input multiplexer 106 associated with the register word 101, the write address decoder 108 signals to the input multiplexer 106 which data input 105 is to be used for supplying the data word to be stored to the register bank 100 and is to be correspondingly switched to the output of the input multiplexer 106. Furthermore, the write address decoder 108 signals to the register word 101 by the enable input 110 of the register word 101 that the data word present at the output of the input multiplexer 106 is to be stored in the register word 101.

Furthermore, the register words 101 are written in accordance with a clock signal which is supplied to the register words 101 by clock inputs 112. If the register words 101 are implemented by means of flip flops, as usual, a high number of flip flops is required. If, for example, 32 register words 101 are provided which can store one data word each of 32 bits length, 1024 flip flops are required.

A high proportion of the power dissipation is produced by supplying the clock to the flip flops. This proportion can be reduced by so-called clock gating. In clock gating, a clock signal is not supplied to all flip flops but only to clock gates which only forward the corresponding clock pulse to a flip flop in one clock cycle when the flip flop is written in the respective clock cycle. In this manner, the signal activity of the clock signals supplied to the flip flops can be reduced.

However, the supply of write data (in the form of the data words to be stored) to the register words 101 leads to a power dissipation, the proportion of the total power dissipation of the register bank 100 of which is greater than the proportion produced by the clock supply to the flip flops. The proportion of the power dissipation produced by supplying the write data cannot be reduced by clock gating.

As shown in FIG. 1 and explained above, the write data, i.e. the data words to be stored, are supplied to all input multiplexers 106 (there is thus a high fanout at the input multiplexers 106). The length of the electrical connections required for this and thus the capacitance of the electrical connections required for this is great for this reason. Furthermore, the capacitance of the inputs of the input multiplexers 106 contributes to the power dissipation. There is one input multiplexer 106 for each register word 101.

According to an exemplary embodiment of the invention, the power dissipation of register banks is reduced.

According to an exemplary embodiment of the invention, a memory arrangement is provided which has a plurality of memory elements, each memory element storing at least one data word which has at least one bit. Furthermore, each memory element can be addressed by means of a plurality of address bits. The memory arrangement has a switching arrangement with a plurality of logic elements, such as switching elements, the plurality of logic elements, starting from a data input of the switching arrangement, being arranged in a binary tree hierarchy in the direction of a number of outputs of the switching arrangement. Each memory element of the plurality of memory elements is coupled to an output of the switching arrangement. The switching arrangement has a plurality of address inputs. Each of the logic elements can be supplied with an address bit by means of an address input of the plurality of address inputs, and the logic element assumes a switching state in dependence on the address bit supplied so that, when the logic elements are supplied with a plurality of address bits by means of the plurality of address inputs, a data word which is supplied to the input of the switching arrangement is output at the output of the switching arrangement to which the memory element is coupled which is addressed by the plurality of address bits supplied.

According to an exemplary embodiment of the invention, a memory arrangement having a plurality of memory elements is provided, each memory element storing at least one data word which has at least one bit. Each memory element can be addressed by means of a plurality of address bits. The memory arrangement has a switching arrangement with a plurality of switching elements, and the plurality of switching elements, starting from a data input of the switching arrangement, is arranged in a binary tree hierarchy in the direction of a number of outputs of the switching arrangement. Each memory element of the plurality of memory elements is coupled to an output of the switching arrangement and the switching arrangement has a plurality of address inputs. Each of the switching elements can be supplied with an address bit by an address input of the plurality of address inputs and the switching element assumes a switching state in dependence on the address bit supplied so that, when the switching elements are supplied with a plurality of address bits by means of the plurality of address inputs, a data word which is supplied to the input of the switching arrangement is output at the output of the switching arrangement to which the memory element is coupled which is addressed by the plurality of address bits supplied.

According to an exemplary embodiment of the invention, a method for addressing a memory arrangement according to the memory arrangement described above is provided.

To illustrate, according to an exemplary embodiment of the invention, data to be written are supplied to the memory elements by a binary tree-like hierarchy of switching elements. Data to be written are illustratively supplied to the root of the binary tree and the switching elements which form the nodes of the binary tree forward a data word to be written, in accordance with address bits supplied to them, to the memory element which is coupled to a leaf of the binary tree and which is addressed by the address bits. A data word is forwarded along a path from the root to a leaf which is coupled to the addressed memory element.

Since a data word to be stored is supplied to the memory element in which it is to be stored along a path of the binary tree, only the electrical connections forming this path need to be set to the corresponding level. No signal change is required on the other electrical connections of the switching arrangement. Furthermore, a data word to be stored is not supplied to all memory elements but only those which are coupled to the corresponding leaf of the binary tree.

Compared with conventional register banks, a signal change occurs only on a few electrical connections and at a few memory element inputs in the write operation. Thus, only a few electrical connections and memory element inputs contribute to the power dissipation of the memory arrangement (which is constructed, for example, as register bank).

Furthermore, the binary tree hierarchy of switching elements can be described by logic functions and can be implemented without special circuit technology by automated semi-custom design flow.

In one embodiment, each switching element has two switching element outputs and one switching element data input and outputs, by the first switching element output or by the second switching element output, in dependence on the address bits supplied to it, a data word, supplied to it by the switching element data input.

The logic elements can be implemented by latches or implemented by AND gates. The memory elements are implemented, for example, in each case by means of at least one flip flop.

An implementation with AND gates enables the register bank to be implemented with little area requirement.

The logic elements can also be implemented by transmission gates or, generally, bistable flip flops. Furthermore, the logic elements can also be implemented by negative logic, OR gates and/or AND gates.

Each memory element stores, for example, one data word which has 32 bits.

The memory arrangement can also have a write address decoder which is coupled to the plurality of memory elements and which, if it is supplied with a plurality of address bits, outputs an enable signal to the memory element which is addressed by the plurality of address bits supplied, the enable signal specifying that a data word which is supplied to the memory element is to be stored by the memory element.

Figure 2:
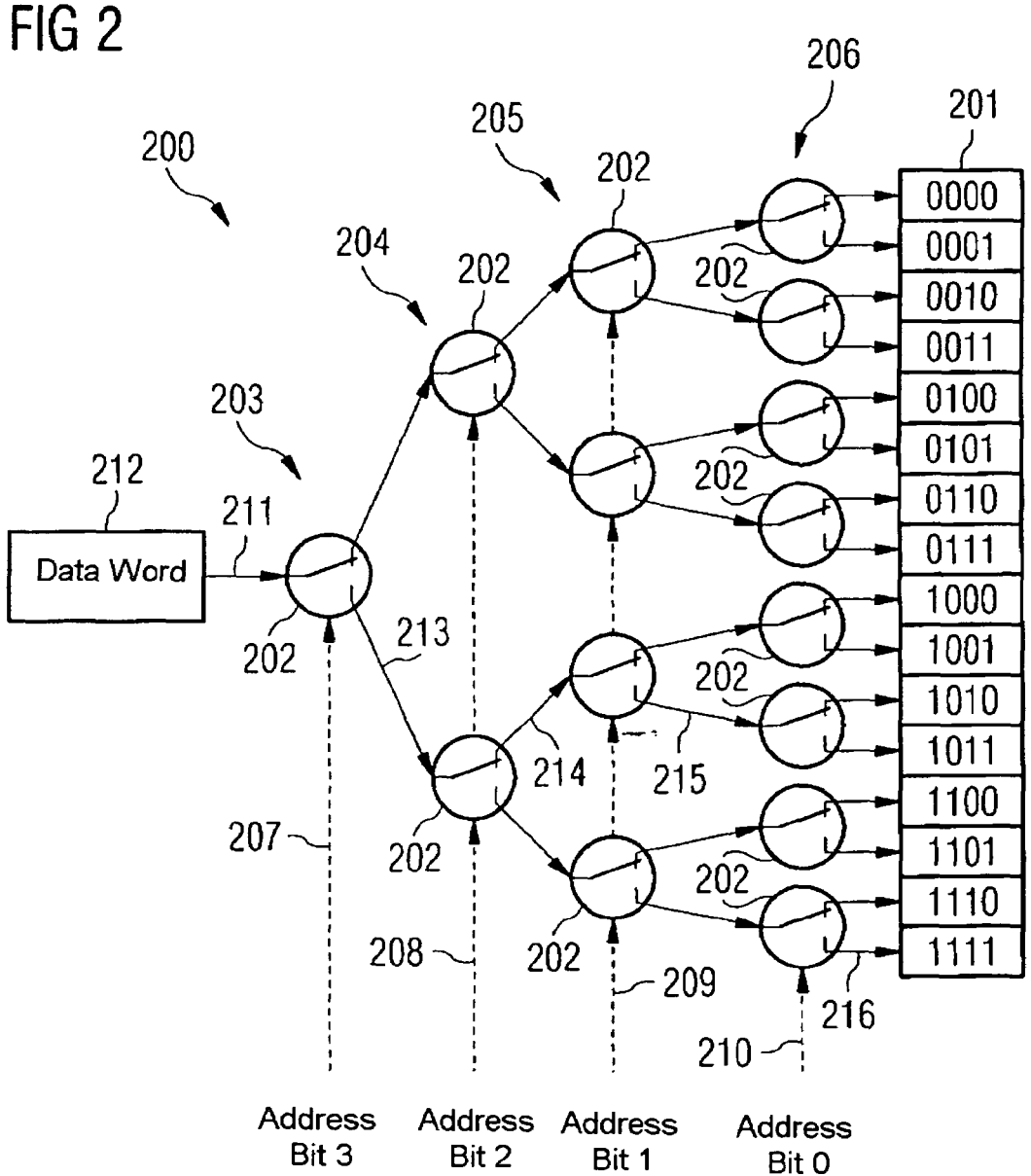
FIG. 2 shows a diagrammatic representation of a register bank.

FIG. 2 shows a diagrammatic representation of a register bank 200 according to an exemplary embodiment of the invention.

The register bank 200 has a plurality of register words 201 by which in each case one data word (for example 32 bits) can be stored. The register bank 200 shown in FIG. 2 (like the register banks shown in FIG. 3 and FIG. 4) has 16 register words. This is done for better clarity whereas a number of register words (for example 32) can be provided in actual embodiments. Since the register bank 200 has 16 register words 201, all 16 register words 201 can be addressed by means of one 4-bit address (bit 0, . . . , bit 3).

The register bank 200 has a plurality of logic elements, such as switching elements 202 which are arranged in the form of a binary tree and are correspondingly arranged in a first plane 203 (illustratively the root of the binary tree), a second plane 204, a third plane 205 and a fourth plane 206. The switching element 202 of the first plane 203 can be supplied with an address bit by a first address bit line 207. Analogously, all switching elements 202 of the second plane 204 can be supplied with address bits by a second address bit line 208, all switching elements 202 of the third plane 205 can be supplied with address bits of a third address bit line 209 and all switching elements 202 of the fourth plane 206 can be supplied with address bits by a fourth address bit line 210.

The register words 201 are to be arranged in such a manner that their address increases from top to bottom, the address of a register word is shown in binary representation in the respective register word in FIG. 2 (correspondingly from 0000 to 1111).

The switching element 202 of the first plane 203 can be supplied with a data word 212 to be stored by means of a data input 211 of the register bank 200. In accordance with the switch position of the switching element 202 of the first plane 203, the switching element 202 of the first plane 203 forwards the data word 212 to a switching element 202 of the second plane 204. Analogously, the switching element 202 of the second plane 204, to which the data word 212 has been forwarded, forwards the data word 212, in accordance with its switch position, to a switching element 202 of the third plane 205 which, in turn, forwards the data word 212 in accordance with its switch position, to a switching element 202 of the fourth plane 206. The switching element 202 of the fourth plane 206 which was supplied with the data word 212 forwards the data word 212, in accordance with its switch position, to a register word 201. This will be explained with reference to an example in the text which follows.

According to the representation in FIG. 2 and the arrangement of the register words 201 so that the address of the register words 201 increases from top to bottom, a switching element 202 illustratively forwards the data word 212 towards the top if it is supplied with a 0 by means of the corresponding address bit line 207, 208, 209, 210 and illustratively forwards it towards the bottom if it is supplied with a 1 by means of the corresponding address bit line 207, 208, 209, 210.

For example, a data word 212, shown as the twelfth one from the top in FIG. 2 and having the binary address 1011 is to be stored in the register word 201. The switching element 202 of the first plane 203 is supplied with the most significant bit of this address, a 1 in this case, by the first address bit line 207. The switching elements 202 of the second plane 204 are supplied with the second most significant bit of this address, the bit with the value 0 in this case, by the second address bit line 208. Analogously, the switching elements 202 of the third plane 206 are supplied with the second least significant bit (bit having the value 1) by the third address bit line 209 and the switching elements 202 of the fourth plane 206 are supplied with the least significant bit (bit having the value 1) by the fourth address bit line 210.

The switching element 202 of the first plane 203 correspondingly forwards the data word 212 towards the bottom along a first lower path 213 (lower edge of the tree) to a switching element 202 of the second plane 204. The switching element 202 of the second plane to which the data word 212 has been forwarded forwards the data word 212 towards the top along an upper path 214 to a switching element 202 of the third plane 205. The switching element 202 of the third plane 205 (supplied with a 1 as address bit) correspondingly forwards the data word 212 towards the bottom along a second lower path 215 to a switching element 202 of the fourth plane 206. The switching element 202 of the fourth plane 206, supplied with a 1, finally forwards the data word 212 along a third lower path 216 to the register word having the binary address 1011 by which the data word 212 is stored.

Furthermore, the register words 201 can have in each case a clock input, by which the respective register word 201 is supplied with a clock signal according to which write operations are carried out, and an enable input by which the register words 201 are supplied with an enable signal, i.e. are informed that the data word supplied to them is to be stored.

The switching elements 202 can be implemented in different ways.

In the text which follows, an embodiment in which the switching elements 202 are in each case implemented by two latches is explained with reference to FIG. 3.

Figure 3:
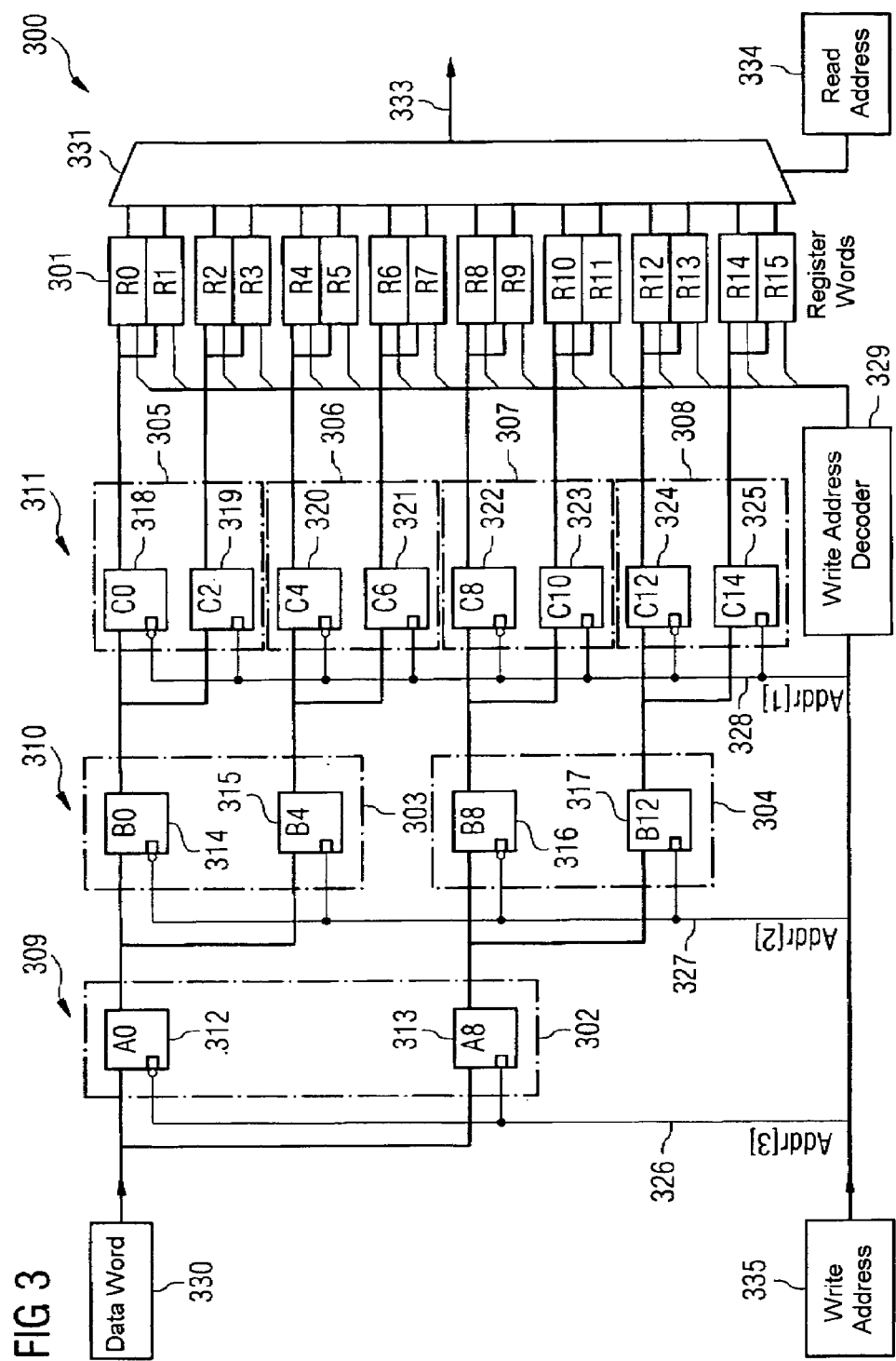
FIG. 3 shows a register bank.

FIG. 3 shows a register bank 300 according to an exemplary embodiment of the invention.

Analogously to the register bank 200 shown in FIG. 2, the register bank 300 has 16 register words (denoted as R0 to R15) 301 which, as explained with reference to FIG. 2, are arranged and addressed in such a manner that the uppermost register word 301 has the binary address 0000, the addresses of the register words 301 increase from top to bottom and the lowermost register word 301 has the binary address 1111. Analogously to the register bank 200 described with reference to FIG. 2, the register bank 300 has a number of switching elements 302 to 308 which are arranged in the form of a binary tree in a first plane 309, a second plane 310 and a third plane 311. Note that, compared with the register bank 200 shown in FIG. 2, a fourth plane of switching elements has been omitted.

Each switching element 302 to 308 is implemented by two latches 312 to 325. For example, a first switching element 302, the switching element of the first plane 309, is implemented by a first latch 312 and a second latch 313.

Analogously to the register bank 200 described with reference to FIG. 2, the first switching element 302 can be supplied with an address bit by means of a first address bit line 326. The switching elements of the second plane 310, which are a second switching element 303 and a third switching element 304, can be supplied with an address bit by means of a second address bit line 327. Analogously, the switching elements of the third plane 311, which are a fourth switching element 305, a fifth switching element 306, a sixth switching element 307 and a seventh switching element 308, can be supplied with an address bit by-a third address bit line 328.

The register bank 300 can be supplied with a write address 335, i.e. an address of a register word 301, by a write address line, the address bit lines 326, 327, 328 branching away from the write address line so that the switching element 302 is supplied with the most significant bit of the write address 335 supplied, the second switching element 303 and the third switching element 304 are supplied with the second most significant bit and the fourth switching element 305, the fifth switching element 306, the sixth switching element 307 and the seventh switching element 308 are supplied with the second least significant bit. The complete write address supplied is also supplied to a write address decoder 329.

A latch 312 to 325 forwards the input data, i.e. the data present at the data input of the latch 312 to 325, to its output if a high level (equivalent to a binary 1 in the present description) is present at the control input of the latch. If the signal present at the control input of a latch 312 to 325 changes from high level to low level, the data last forwarded at the output of the latch 312 to 325 before the change are stored (for the duration for which the low level is present) and output at the output of the latch 312 to 325 independently of the input data present at the latch 312 to 325.

In the present exemplary embodiment, the latches 312 to 325 are supplied with a data word with 32 bits width and, correspondingly, the latches 312 to 325 output a data word of 32 bits width. Such latches can be implemented by using 32 1-bit latches, the 1-bit latches used for implementing a latch being supplied with the same control signal.

As mentioned, each switching element 302 to 308 is implemented by two latches 312 to 325. In accordance with the plane 309 to 311 in which one switching element 302 to 308 is located, one of these two latches 312 to 325 (always the lower one in FIG. 3) is supplied with the address bit supplied to the switching element 302 to 308 by the corresponding address bit line 326, 327, 328. The other one of these two latches (always the upper one in FIG. 3) is supplied with the negated value of said address bit. For example, the first latch 312 is supplied with the negated value of the bit which is supplied to the first switching element 302 by the first address bit line 326, and the second latch 313 is supplied with the address bit which is supplied to the first switching element 302 by the address bit line 326.

Analogously to the description of FIG. 2, the operation of the register bank 300 will be explained in the text which follows by the example that a data word 330 supplied is to be stored in the register having the binary address 1011, called R11 in FIG. 3. The data word 330 is supplied to the first switching element 302, it being supplied to the first latch 312 and the second latch 313. A binary 1 is supplied to the first switching element 302 by the first address bit line 326. Correspondingly, the value 0 is supplied to the control input of the first latch 312 and the value 1 is supplied to the control input of the second latch 313.

Correspondingly, the first latch 312 continues to output the data word stored in it and there is thus no signal change at the output of the first latch 312 and correspondingly there is also no signal change at the output of the latches coupled to the output of the first latch 312. Illustratively, no signal change takes place in the upper part of the binary tree, i.e. the part of the binary tree consisting of the latches which are designated by A0, B0, B4, C0, C2, C4 and C6 in FIG. 3. This part of the binary tree thus does not produce any power dissipation.

In contrast, the second latch 313, since a 1 is present at its control input, forwards the data word 330 to a second switching element 304. The second switching element 304 is supplied with a binary 0 by the second address bit line 327. Correspondingly, the output signal of a third latch 317 (designated by B12 in FIG. 3) does not change and, analogously to above, the sent part-tree having the third latch 317 as a root does not contribute to the power dissipation since there is no signal change in this part-tree.

At the further latch of the second switching element 304, a fourth latch 316 designated by B8 in FIG. 3, however, a binary 1 is present at the control input since the signal of the second address bit line 327 is negated, and, correspondingly, the fourth latch 316 forwards the data word 330. In the third plane 311, a fifth latch 323 of a third switching element 307 correspondingly forwards the data word 330 (a binary 1 is supplied to the switching element 307 by means of the third address bit line 328) and a sixth latch 322, the top latch of the third switching element 307 in FIG. 3, does not forward the data word 330 so that there is no signal change at the output of the sixth latch 322.

Starting from the output of the fifth latch 323, the data word 330 is supplied to two register words 301 (note that there is no fourth plane of switching elements), namely the register word 301 designated by R10 in FIG. 3, i.e. the register word having the address 1010, and the register word 301 designated by R11 in FIG. 3, i.e. the register words having the address 1101 in which data word 330 is also to be stored.

The register having the address 1011 is the only one of the register words 301 which receives an enable signal from the write address decoder, which has the effect that the data word 330 present at the input of the register word 301 having the address 1101 is stored in the register word 301. The write address decoder 329 determines to which one of the register words 301 an enable signal is to be sent on the basis of the write address supplied to it, the address 1011 in the present case.

Note that the control signal present at a latch, the input signal of which remains constant (for example the latch designated by B0 in FIG. 3), is unimportant since the output signal of the latch also remains constant in every case.

The outputs of the register words 301 are also coupled to a multiplexer 331 which is controlled by a read address in such a manner that, by a data output 333 of the register bank 300, the data word is output which is stored by the register word 301 which is addressed by a read address 334.

In the register bank 300, only one data word 330 can ever be stored simultaneously by a register word 301. In one embodiment, a number of write ports (inputs for write data) are provided and, for each write port, a binary tree hierarchy of switching elements analogously to those shown in FIG. 3 is provided, each binary hierarchy of switching elements, like the binary tree hierarchy of switching elements 302 to 308 shown in FIG. 3, being coupled to all the register words 301 so that data words which are supplied to the register bank by the write ports can be stored simultaneously by the register words 301. Furthermore, a multiplexer, not shown in the figures, is connected between the write ports and the binary hierarchies of switching elements.

If the register bank 300 has more than 16 register words 301, for example 32, a fourth plane of switching elements, which is set up and arranged analogously to the planes 309, 310, 311 of switching elements 302 to 308 (and correspondingly has 16 switching elements) is provided in one embodiment. Correspondingly, if the register bank 300 has 64 register words 301, a fifth plane of switching elements can be provided, etc. However, this is not absolutely necessary, as fewer planes of switching elements can also be provided. It must be pointed out that the expansion with respect to the register bank 300, described above, can also be provided in the register bank 200.

The enable signal of the write address decoder 329 controls which register word 301 will accept the write data supplied (the data word supplied).

In most cases, the data word 330 to be written and the write address 335 changes from write operation to write operation. If the signal change from one data word 330 to a data word 330 to be written in the next write operation and the corresponding change of the write address 335 to the write address 335 to be used in the next write operation happens simultaneously, the path along the binary tree hierarchy (consisting of planes 309, 310, 311) is charged to the level corresponding to the data word 330 to be stored, as described above (the remaining electrical connections do not change their level, as described above). The path to the register word 301 which has been written in the previous write operation does not change its state, i.e. there are no signal changes along this path.

However, it requires very complex circuitry for such a change from one data word 330 to another data word 330 and a change from one write address 335 to another write address 335 from one write operation to a subsequent write operation to take place simultaneously. In one embodiment, this complexity is dispensed with and the change from data word 330 to data word 330 (i.e. the change of the data signals) and the change from write address 335 to write address 335 (i.e. the address signal change) from write operation to write operation do not take place simultaneously.

If the data signal change takes place before the write address signal change, it is not only the electrical connections along the path leading to the register word 301 currently to be written which are set to the level corresponding to the data word 330 to be currently stored, but also the path leading to the register word 301 to be written in the previous memory operation.

If, conversely, the write address signal change takes place before the data signal change, the path leading to the register word 301 currently to be written is first set to the level corresponding to the data word 330 to be stored in the previous write operation and then set to the level corresponding to the data word 330 currently to be written (after the data signal change has taken place).

Nevertheless, only a maximum of two paths or one path, respectively, are recharged twice so that the power dissipation of the register bank 300 is considerably reduced compared with conventional register banks. This is the case, for example, if the register bank 300 has a high number of register words 301.

In the register bank 300 shown in FIG. 3, inserting latches by synthesis tools which are used for circuit generation based on hardware description languages may be very complex.

Figure 4:
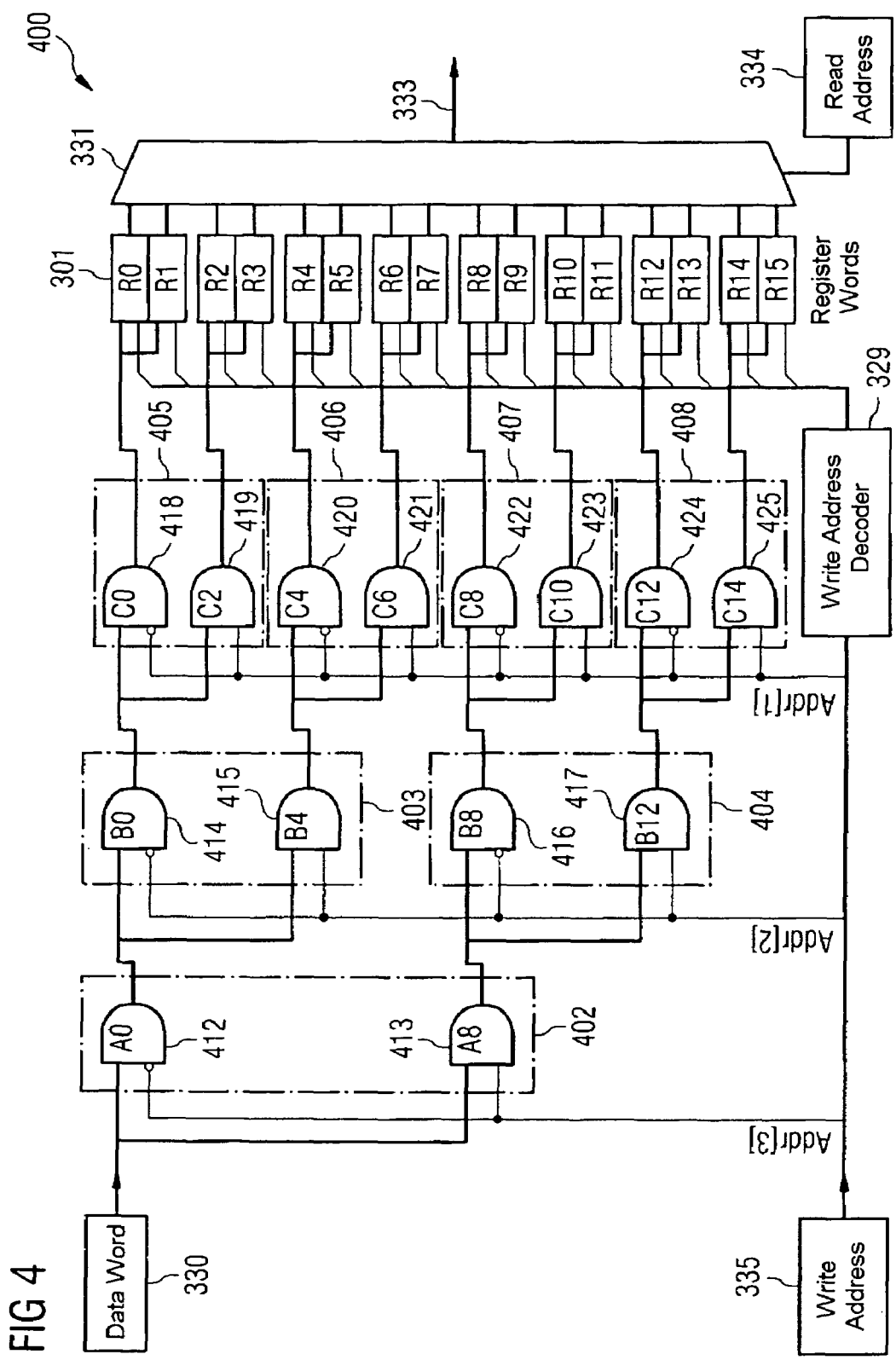
FIG. 4 shows a register bank.

FIG. 4 shows a register bank 400 according to an exemplary embodiment of the invention. The register bank 400 is built up analogously to the register bank 300 shown in FIG. 3. The difference is that the switching elements 402 to 408 (corresponding to the switching elements 302 to 308) do not have two latches 312 to 325 in each case but have two AND gates 412 to 425 in each case. The AND gates 412 to 425 are arranged and connected analogously to the latches 312 to 325.

In contrast to a latch 312 to 325, an AND gate 412 to 425 does not store the data last forwarded by it but constantly outputs the value 0 if it is supplied with a low level (i.e. a logical 0) by its control input which is here connected to the corresponding address bit line 426, 427, 428 analogously to FIG. 3.

Compared with the register bank 300, an additional signal change (to the value 0) is thus produced with each write address signal change (that is to say typically after each write operation). However, the register bank 400 can be implemented with great saving of space in a simple manner since AND gates require a much smaller chip area than latches. Furthermore, AND gates can be inserted without restrictions by synthesis tools.

Figure 5:
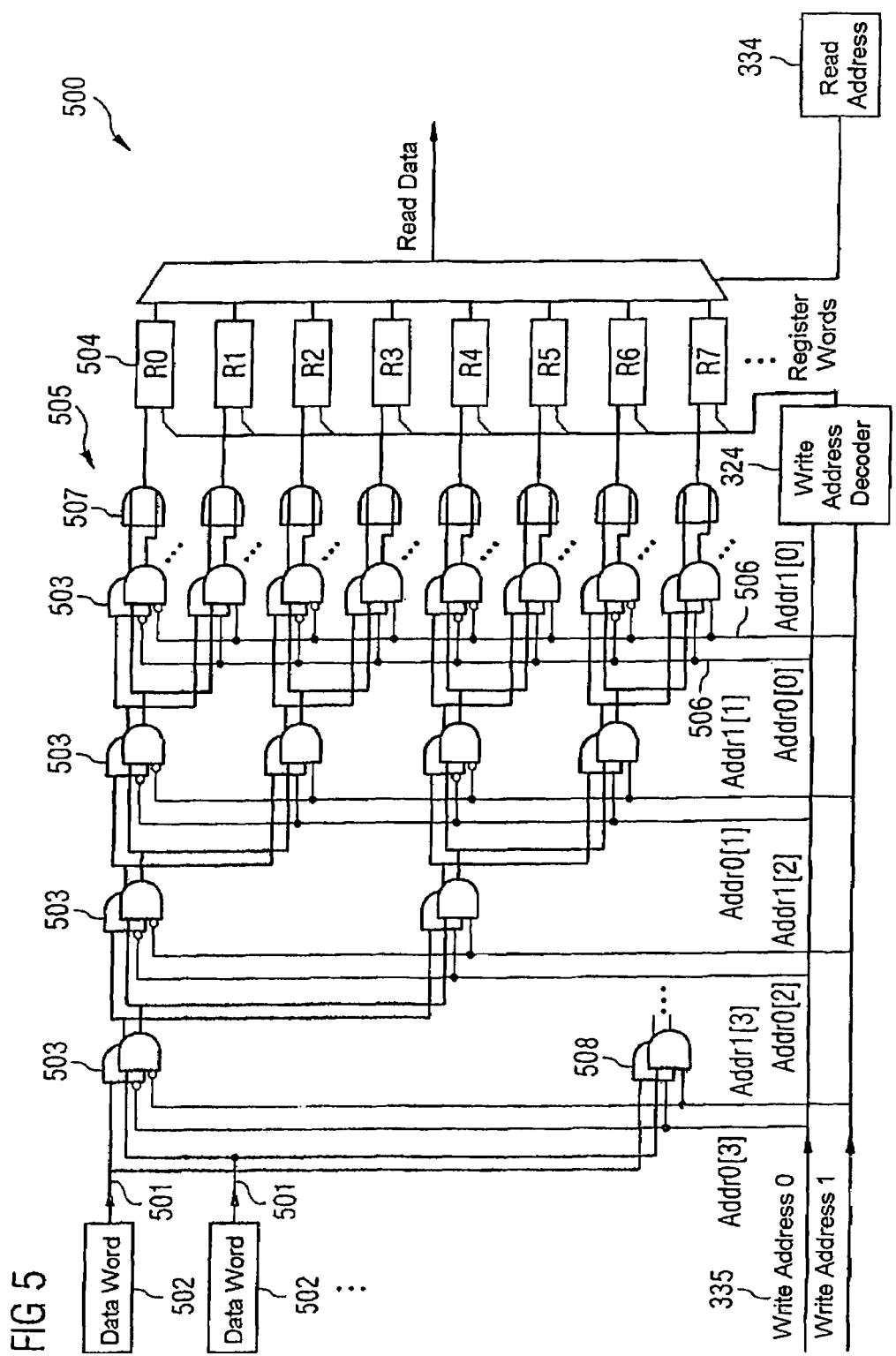
FIG. 5 shows a register bank.

The register bank 400 can be expanded so that it has a number of write data inputs, as is shown in FIG. 5. FIG. 5 shows a register bank 500 according to an exemplary embodiment of the invention.

The register bank 500 can be supplied in parallel with a number of data words 502, by a number of write data inputs 501. Each write data input 501 is coupled to a plurality of register words 504 (of which eight, denoted by R0 to R7, are shown) by a tree-shaped hierarchy of AND gates which is arranged analogously to the hierarchy of AND gates in the register bank 400 described with reference to FIG. 4. Correspondingly, the register bank 500 can be supplied with a plurality of write addresses 335, such as write address 0 and write address 1 as shown in FIG. 5.

Analogously to the register bank 400 shown in FIG. 4, the data words 502 of FIG. 5 are, in a first stage of the tree-shaped hierarchy of AND gates, supplied to AND gates 503 and AND gates 508, wherein the AND gates 503 are supplied with the negated most significant address bit of the write addresses 335 and the AND gates 508 are supplied with the (nonnegated) most significant address bit of the write addresses 335. The outputs of the AND gates 503, 508 are connected to other AND gates arranged in a tree structure, which is for simplicity not shown for the AND gates 508 but only indicated by the three dots shown to the right of the AND gates 508.

Compared with the register bank 400 described with reference to FIG. 4, the register bank 500 has (for each write data input 501) an additional plane 505 of AND gates (i.e. an additional plane of switching elements). The AND gates 503 of the additional plane 505 are supplied with the least significant bit (or the negated least significant bit, respectively) by an additional address bit line 506, the additional plane 505 and the additional address bit line 506 being provided correspondingly for each write data input 501. Write data are only output by those AND gates 503 of the additional plane 505 which are addressed by the corresponding write address. All other AND gates 503 of the additional plane 505 output the logical value 0.

The selection of write data supplied to the corresponding register words in the plurality of register words 504 can be implemented by a plurality of OR gates 507. It is thus not necessary that a plurality of input multiplexers is provided for the plurality of register words 504. Furthermore, no drive circuit for input multiplexers is required which provides the corresponding selection signals for the input multiplexers.

In this embodiment, write data which are to be written into the same register word of the plurality of register words 504 by a number of write data inputs 501 can also be combined accordingly by the corresponding OR gate of the plurality of OR gates 507, i.e. the write data can be combined by a bit-by-bit OR function, in such a manner that the desired part of the write data is stored in the corresponding register word 504.

This can be utilized, for example, in the case of parallel processor architectures (for example VLIW, very long instruction word) so that a number of processor elements can simultaneously write data into different bit fields of a register word. In conventional register banks, in contrast, it is not allowed that a number of data sources simultaneously write data into the same register word.

It is therefore intended that the foregoing detailed description be regarded as illustrative rather than limiting, and that it be understood that it is the following claims, including all equivalents, that are intended to define the spirit and scope of this invention.

What is claimed is:

1. A memory arrangement, comprising:
a plurality of memory elements, wherein each memory element stores at least one data word, the at least one data word including at least one bit and each memory element addressable by a plurality of address bits; and
a switching arrangement comprising:
a plurality of logic elements; and
a plurality of address inputs;
wherein the plurality of logic elements, starting from a data input of the switching arrangement, comprises a binary tree hierarchy in a direction of a number of outputs of the switching arrangement, each memory element of the plurality of memory elements being coupled to an output of the switching arrangement, each of the logic elements of the plurality of logic elements suppliable with an address bit by an address input of the plurality of address inputs and each of the logic elements of the plurality of logic elements assuming a switching state based on the address bit supplied, such that, when the plurality of logic elements are supplied with the plurality of address bits by the plurality of address inputs, the at least one data word which is supplied to the input of the switching arrangement is output at the switching arrangement to which the memory element is coupled and which is addressed by the plurality of address bits.

2. The memory arrangement of claim 1, wherein each logic element comprises two logic element outputs and one logic element data input, the logic element configured to output the at least one data word, by the first switching element output or by the second switching element output, the data word supplied to the switching element by the switching element data input, based on the plurality of address bits.

3. The memory arrangement of claim 1, wherein the logic elements comprise latches.

4. The memory arrangement of claim 1, wherein the logic elements comprise AND gates.

5. The memory arrangement of claim 1, wherein the memory elements comprise at least one flip flop.

6. The memory arrangement of claim 1, wherein each memory element stores a data word comprising 32 bits.

7. The memory arrangement of claim 1, further comprising a write address decoder coupled to the plurality of memory elements and which, when supplied with a plurality of address bits, is configured to output an enable signal to the memory element which is addressed by the plurality of address bits, wherein the enable signal specifies that the at least one data word supplied to the memory element is stored in the memory element.

8. A memory arrangement, comprising:
a plurality of memory elements, wherein each memory element of the plurality of memory elements stores at least one data word which has at least one bit and can be addressed by a plurality of address bits; and
a plurality of switching elements, wherein the plurality of switching elements, starting from a data input of the switching arrangement, includes a binary tree hierarchy in a direction of a number of outputs of the switching arrangement, each memory element coupled to an output of the switching arrangement, and wherein the switching arrangement includes a plurality of address inputs; each of the switching elements suppliable with an address bit by an address input and the switching element assuming a switching state based on the plurality of address bits so that, when the switching elements are supplied with the plurality of address bits by the plurality of address inputs, the at least one data word which is supplied to the input of the switching arrangement is output by the switching arrangement to which the memory element is coupled and which is addressed by the plurality of address bits.

9. The memory arrangement of claim 8, wherein each switching element comprises two switching element outputs and one switching element data input, the switching element configured to output a data word, by the first switching element output or by the second switching element output, based on the address bit supplied to the switching element and supplied to the switching element by the switching element data input.

10. The memory arrangement of claim 8, wherein the switching elements comprise latches.

11. The memory arrangement of claim 8, wherein the switching elements comprise AND gates.

12. The memory arrangement of claim 8, wherein the memory elements comprise least one flip flop.

13. The memory arrangement of claim 8, wherein each memory element stores a data word comprising 32 bits.

14. The memory arrangement of claim 8, further comprising a write address decoder coupled to the plurality of memory elements and which, when supplied with a plurality of address bits, is configured to output an enable signal to the memory element which is addressed by the plurality of address bits supplied, wherein the enable signal specifies that a data word which is supplied to the memory element is stored by means of the memory element.

15. A method for addressing a memory arrangement, the memory arrangement including a plurality of memory elements, wherein each memory element stores at least one data word which has at least one bit, each memory element can be addressed by a plurality of address bits, the memory arrangement includes a switching arrangement with a plurality of switching elements, the plurality of switching elements, starting from a data input of the switching arrangement, includes a binary tree hierarchy in a direction of a number of outputs of the switching arrangement, each memory element of the plurality of memory elements coupled to an output of the switching arrangement, wherein the switching arrangement includes a plurality of address inputs, the method comprising:

supplying an address bit to each of the switching elements by an address input of the plurality of address inputs; and determining a switching state of the switching element based on the address bit supplied;

wherein supplying the address bits comprises supplying a data word to the input of the switching arrangement and outputting the data word at the output of the switching arrangement to which the memory element is coupled which is addressed by the plurality of address bits supplied.

16. A memory arrangement, comprising:

means for storing data, wherein each means for storing data stores at least one data word, the at least one data word including at least one bit and each means for storing data addressable by a plurality of address bits; and a switching arrangement comprising:

means for switching; and a plurality of address inputs;

wherein the means for switching, starting from a data input of the switching arrangement, comprises a binary tree hierarchy in a direction of a number of outputs of the switching arrangement, each means for storing data being coupled to an output of the switching arrangement, each of the means for switching being suppliable with an address bit by an address input of the plurality of address inputs and each of the logic elements of the means for switching assuming a switching state based on the address bit supplied, such that, when the means for switching are supplied with the plurality of address bits by the plurality of address inputs, the at least one data word which is supplied to the input of the switching arrangement is output at the switching arrangement to which the means for storing data is coupled and which is addressed by the plurality of address bits.

* * * * *